(12) United States Patent
Lam

(10) Patent No.: US 9,921,266 B1
(45) Date of Patent: Mar. 20, 2018

(54) GENERAL UNIVERSAL DEVICE INTERFACE FOR AUTOMATIC TEST EQUIPMENT FOR SEMICONDUCTOR TESTING

(71) Applicant: Advantest Corporation, Tokyo (JP)

(72) Inventor: Daniel Lam, San Jose, CA (US)

(73) Assignee: ADVANTEST CORPORATION, Tokyo (JP)

( * ) Notice: Subject to any disclaimer, the term of this patent is extended or adjusted under 35 U.S.C. 154(b) by 0 days.

(21) Appl. No.: 15/414,512

(22) Filed: Jan. 24, 2017

(51) Int. Cl.
*G01R 31/28* (2006.01)

(52) U.S. Cl.
CPC ..... *G01R 31/2889* (2013.01); *G01R 31/2834* (2013.01)

(58) Field of Classification Search
CPC ............ G01R 1/07378; G01R 31/2834; G01R 31/2887
See application file for complete search history.

(56) References Cited

U.S. PATENT DOCUMENTS

| | | | | |
|---|---|---|---|---|
| 2002/0155758 A1* | 10/2002 | Wang | ................. | H01R 13/6658 439/620.17 |
| 2004/0029406 A1* | 2/2004 | Loveless | ................ | H01R 24/50 439/63 |
| 2005/0233610 A1* | 10/2005 | Tutt | .................... | H01R 13/2414 439/66 |
| 2011/0074457 A1* | 3/2011 | Roderick | ............. | G01R 1/0466 324/756.02 |
| 2011/0193584 A1* | 8/2011 | Roberts | .............. | G01R 31/2889 324/756.02 |
| 2011/0227595 A1* | 9/2011 | Takeshita | ........... | G01R 31/2889 324/756.02 |
| 2011/0248737 A1* | 10/2011 | Takeshita | ........... | G01R 31/2889 324/756.02 |
| 2013/0178077 A1* | 7/2013 | Lai | ........................ | H01R 27/02 439/65 |

\* cited by examiner

*Primary Examiner* — Jermele M Hollington
*Assistant Examiner* — Alvaro Fortich

(57) ABSTRACT

Embodiments of the present disclosure include a modular load board or "frame" that contains a number of moveable connectors. The moveable connectors can be selectively displaced within the frame, as needed, to mate with test head pogo-pins and can be fixed in place on the frame using screws. Embodiments of the present disclosure provide multiple moveable sockets that can be positioned as needed within the frame so that a quick prototype modular load board can be designed and readily modified, if need be, without requiring hard wired traces within the PCB to connect the DUT socket to the test head interface regions. Using ribbon cables, embodiments of the present disclosure eliminate the need to have any hard wired traces within a PCB load board between the DUT socket and pogo pin interface blocks.

20 Claims, 10 Drawing Sheets

700

701 — A miniature test board, including a DUT stored therein, is tested by a user in a first testing session within a testing environment that does not include the UDI assembly. During this first testing session, various tests are performed on the miniature test board to gather metrics (e.g., benchmark tests) in a manner that provides the user with an understanding about the general performance of the DUT installed within miniature test board in an environment that is separate from a testing environment involving the use of UDI assembly.

702 — Provided a determination is that the miniature test board and DUT stored therein yielded desirable results during the first testing session, the miniature test board is imported and installed within a DUT mounting location of a UDI assembly for testing during a second testing session.

703 — A determination is made that the physical configuration of the circuits stored within the UDI assembly (e.g., moveable connectors, miniature test board) is satisfactory based on the quality of the performance of electrical connections formed on the miniature test board and moveable connectors stored within the frame of UDI assembly.

704 — The final positions of the moveable connectors and miniature test board in the configuration determined at step 703 is saved as a final design for fabricating a new load board (e.g., mother board, daughter board) for an end user. The new PCB is fabricated to replace frame using tracing materials to trace a route from the final positions of the moveable connectors stored within connector mounting locations to a final position of a DUT positioned within the miniature test board of the same configuration.

FIG. 7

GENERAL UNIVERSAL DEVICE INTERFACE FOR AUTOMATIC TEST EQUIPMENT FOR SEMICONDUCTOR TESTING

CROSS-REFERENCE TO RELATED APPLICATIONS

This application is related to patent application: "PRODUCTION-LEVEL MODULARIZED LOAD BOARD PRODUCED USING A GENERAL UNIVERSAL DEVICE INTERFACE FOR AUTOMATIC TEST EQUIPMENT FOR SEMICONDUCTOR TESTING," concurrently filed with this application, with U.S. Ser. No. 15/414,507 which is herein incorporated by reference in its entirety.

BACKGROUND

Automatic Test Equipment (ATE) is commonly used within the field of electronic chip manufacturing for the purposes of testing electronic components. ATE systems both reduce the amount of time spent on testing devices to ensure that the device functions as designed and serve as a diagnostic tool to determine the presence of faulty components within a given device before it reaches the consumer. ATE systems can perform a number of test functions on a device under test (DUT) through the use of test signals transmitted to and from the DUT. As depicted in prior art FIG. 1, conventional ATE systems are very complex electronic systems and generally include use of a load board, such as load board 100. Load board 100 is a highly specialized and customized printed circuit board (PCB). The load board 100 is designed to interface with a customer's DUT and interface with a test head (not pictured) of a production integrated circuit tester system for testing the DUT. The DUT is generally secured to a socket within the physically large PCB.

Load board 100 contains specialized traces within the PCB that lead to the DUT I/O pins (to the socket) and to specialized pin interface regions of the PCB (e.g., pogo pin interface blocks 100a) which contain pads that make physical connections to interfaces of the test head via pogo pins located on the test head. In this fashion, the test head can directly interface with the load board to test the DUT. The locations of these pogo pin interface blocks and their connections to the socket that hold the DUT are customized to the DUT and are complex. If there are any errors in either the placement of the pads, the arrangement of the signal pins on the pads, or their connections to the sockets or the traces between the socket and the pogo pin interface blocks, an entirely new and corrected load board must be designed and manufactured, which can take several months. Moreover, due to the large trace routing of the PCB, corrected load boards can often be expensive to produce. Therefore, it is not convenient when load board errors are discovered and very costly to correct.

SUMMARY OF THE INVENTION

Accordingly, a need exists for solution that can address the problems with the approaches described above. Using the beneficial aspects described herein, without their respective limitations, embodiments of the present disclosure provide a novel solution to address these problems.

Embodiments of the present disclosure include a modular load board or "frame" that contains a number of non-pogo pin interface connectors or "moveable connectors" capable of being repositioned around the frame via a number of discrete frame mounting locations. The moveable connectors include a pogo pin pad interface on the bottom for interfacing with the pogo pins on the test head and a slot on the top for interfacing with an edge connector (or discrete pin connector) of one side of a flexible ribbon or discrete cable. The other end of the ribbon or discrete cable is for interfacing with a slot connector (or discrete pin connectors) of a daughter board which directly connects to the socket that holds the DUT. The socket that holds the DUT is also located on the daughter board, which can be a PCB.

The moveable connectors can be readily displaced within the frame, as needed, to mate with test head pogo-pins and can be fixed in place on the frame using screws. With this modular design, embodiments of the present disclosure provide multiple moveable sockets that can be positioned as needed within the frame and each moveable connector is then mated with a flexible ribbon or discrete cable that is then connected to a connector on the daughter board (which can be mounted in the center of the frame). In this fashion, the connector on the daughter board directly mates to the DUT socket. As such, a rapidly produced and easily modified prototype modular load board can be designed and readily modified, if need be, without requiring hard wired traces within the PCB to connect the DUT socket to the test head interface regions. Using cables, such as flexible ribbon or discrete cables, embodiments of the present disclosure eliminate the need to have any hard wired traces within a PCB load board between the DUT socket and pogo pin interface blocks. If a connection error is discovered, the cable can be easily moved to the proper connection. Using moveable connectors that mate to the ribbon cables and to the test head in the manner described herein provide added flexibility during testing sessions.

Once the combination of the daughter board and the load board frame yield a final design for testing, the load board frame can be replaced with a specialized mother board PCB that has fixed interface pins for the tester head, e.g., pogo-pin interfaces. In the mother board PCB, the traces from the tester head interface pins can then be routed (traced) to connectors at fixed positions on the mother board PCB that physically align with the physical interface connectors on the daughter board, whose locations are already known. The daughter board can then be physically connected to the mother board PCB to yield a final modular load board that can be used for production-level testing.

More specifically, in one embodiment, the present invention is implemented as an apparatus for testing a device under test (DUT). The apparatus includes a frame that includes a DUT mounting location, in which the DUT mounting location is adapted to removeably mount a miniature test board configured to electrically and physically interface with the DUT during a testing session. The frame also includes a plurality of connector mounting locations operable to align with a plurality of interfaces of a test head, in which each connector mounting location is adapted to removeably mount a respective removable connector from a plurality of removable connectors operable to be connected to the plurality of interfaces of the test head in which each removable connector is coupled to a respective flexible cable of a plurality of flexible cables, in which the plurality of flexible cables are operable to connect, respectively, to a plurality of cable interfaces of the miniature test board, in which the DUT is configured to receive and transmit test signals associated with the test head using the plurality of flexible cables, the plurality of removable connectors and the plurality of cable interfaces.

In one embodiment, the frame includes a plurality of fastening holes, in which each connector mounting location of the plurality of connector mounting locations includes a set of fastening holes of the plurality of fastening holes and is adapted to mount a respective removable connector from the plurality of removable connectors using the set of fastening holes.

In one embodiment, a respective removable connector of the plurality of removable connectors is removeably mounted onto a respective connector mounting location of the plurality of connector mounting locations using a pair of fastening holes from the plurality of fastening holes. In one embodiment, the frame further includes a plurality of fastening holes located along portions thereof surrounding the DUT mounting location to mount the miniature test board.

In one embodiment, the frame further includes a plurality of fastening holes for aligning and mounting the frame to the test head. In one embodiment, the DUT mounting location is positioned between the plurality of connector mounting locations. In one embodiment, the frame includes a handle.

In one embodiment, the present invention is implemented as an apparatus for testing a device under test (DUT). The apparatus includes a frame that includes a DUT mounting location adapted to removeably mount a daughter board configured to electrically and physically interface with said DUT during a testing session. The frame also includes a plurality of connector mounting locations operable to align with a plurality of interfaces of a test head, in which each connector mounting location is adapted to removeably mount a respective removable connector from a plurality of removable connectors operable to be connected to the plurality of interfaces of said test head in which each removable connector is coupled to a respective flexible cable of a plurality of flexible cables, in which the plurality of flexible cables are operable to connect, respectively, to a plurality of cable interfaces of the daughter board, in which the DUT is configured to receive and transmit test signals associated with the test head using the plurality of flexible cables, the plurality of removable connectors and the plurality of cable interfaces.

The frame also includes a first plurality of fastening holes disposed in the plurality of connector mounting locations for removeably mounting the plurality of removeable connectors. In one embodiment, the DUT mounting location is positioned between at least two connector mounting locations of the plurality of connector mounting locations. In one embodiment, each connector mounting location of the plurality of connector mounting locations is adapted to store different removable connectors from said plurality of removable connectors using said plurality of fastening holes.

In one embodiment, a respective removable connector of the plurality of removable connectors is mounted onto a respective connector mounting location of the plurality of connector mounting locations using a respective pair of fastening holes from the plurality of fastening holes. In one embodiment, the frame further includes a second plurality of fastening holes located along portions of the frame surrounding the DUT mounting location to mount the daughter board to the frame.

In one embodiment, the frame further includes a third plurality of fastening holes for aligning and mounting the frame to the test head. In one embodiment, the DUT mounting location includes a larger portion of the frame relative to a connector mounting location of the plurality of connector mounting locations and where the plurality of flexible cables include ribbon cables.

In one embodiment, the present invention is implemented as an apparatus for testing a device under test (DUT). The apparatus includes a frame that includes a first mounting location, in which the first mounting location is adapted to removeably mount a miniature test board configured to electrically and physically interface with the DUT during a testing session and where the miniature test board includes a plurality of cable interfaces. The frame also includes a plurality of second mounting locations operable to align with a plurality of interfaces of a test head, in which each second mounting location is adapted to removeably mount a respective removable connector from a plurality of removable connectors operable to be connected to the plurality of interfaces of the test head in which each removable connector is coupled to a respective ribbon cable of a plurality of ribbon cables, in which the plurality of ribbon cables are operable to connect, respectively, to the plurality of cable interfaces of the miniature test board, in which the DUT is configured to receive and transmit test signals associated with the test head using the plurality of ribbon cables, the plurality of removable connectors and the plurality of cable interfaces.

In one embodiment, the frame further includes a plurality of fastening holes, in which each second mounting location of the plurality of second mounting locations is adapted to mount different removable connectors from the plurality of removable connectors using the plurality of fastening holes. In one embodiment, in which a respective removable connector of the plurality of removable connectors is mounted onto a respective second mounting location of the plurality of second mounting locations using a pair of fastening holes from the plurality of fastening holes.

In one embodiment, the frame further includes a plurality of fastening holes located along portions of the frame surrounding the first mounting location to mount the miniature test board to the frame. In one embodiment, the frame includes a plurality of fastening holes for aligning and mounting the frame to the test head. In one embodiment, the first mounting location is positioned in a central location of the frame.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 7 is another flow chart depicting a testing process using an exemplary universal device interface assembly in accordance with embodiments of the present disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Figure 2A:
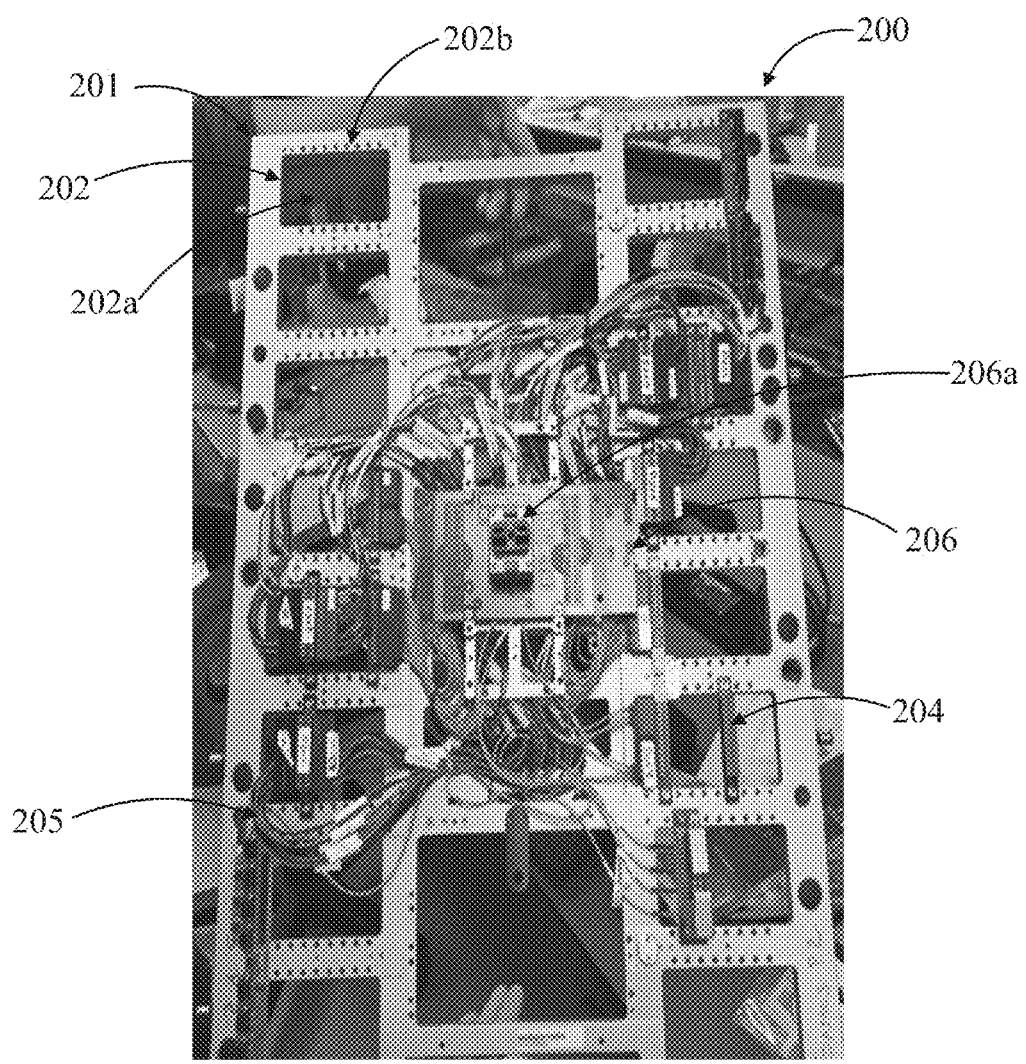
FIG. 2A is a perspective view of an exemplary universal device interface assembly in accordance with embodiments of the present disclosure.
Figure 2B:
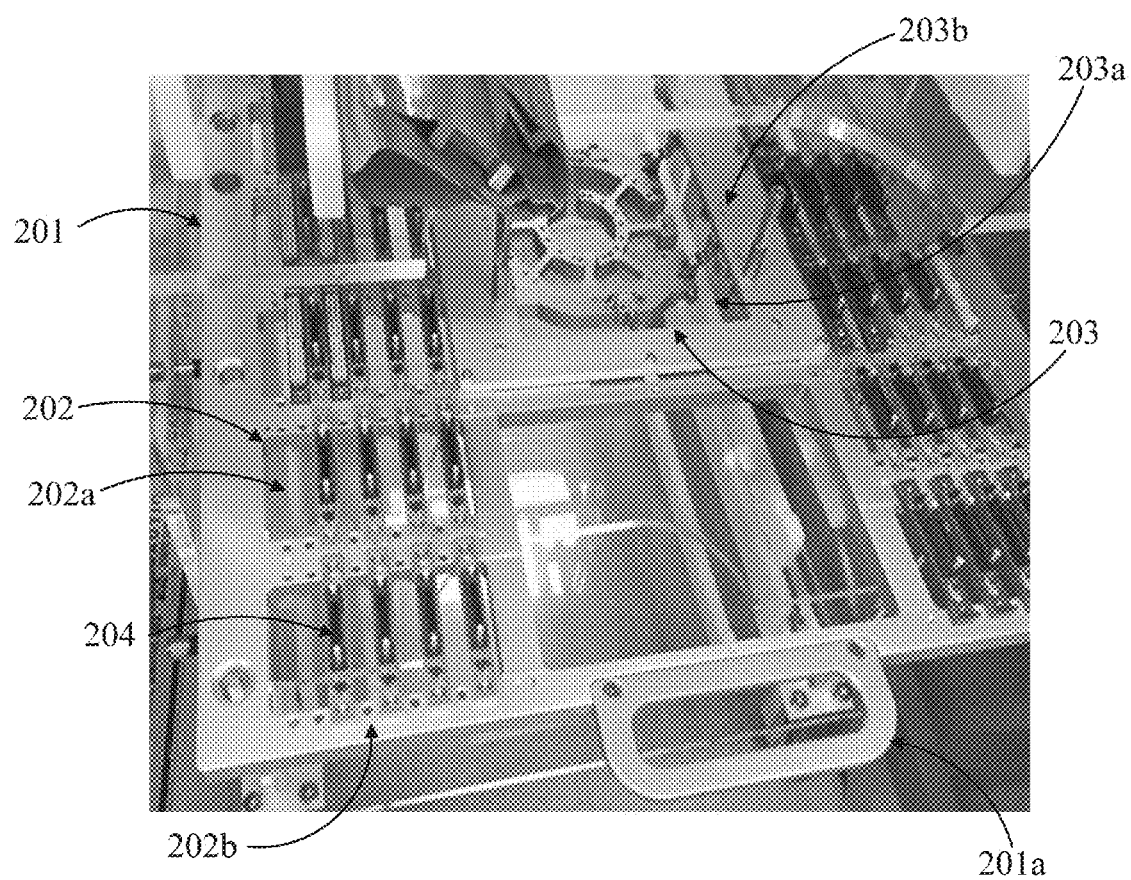
FIG. 2B is another perspective view of an exemplary universal device interface assembly in accordance with embodiments of the present disclosure.

FIGS. 2A and 2B depict an exemplary universal device interface assembly (UDI) in accordance with embodiments of the present disclosure. UDI assembly 200 or load board generally includes frame 201, connector mounting locations 202, DUT mounting location 203 (see, e.g., FIG. 2B), and moveable connectors 204.

According to one embodiment of the present disclosure, frame 201 may be a modularized design load board used for prototyping a final load board design. As illustrated in, for example, FIGS. 2A and 2B, frame 201 is generally rectangular in shape and can include one or more handles for facilitating installation and/or uninstallation within a testing environment (see, e.g., handles 201a in FIG. 2B). Frame 201 includes a number of discrete connector mounting locations 202 for storing moveable connectors 204. Moveable connectors 204 can be installed and/or removed from various different locations on frame 201 using the connector mounting locations 202.

Each connector mounting location of connector mounting locations 202 includes an aperture (e.g., aperture 202a) for storing a moveable connector. The dimensions (e.g., height, width, depth) of each aperture 202a may be uniform among different connector mounting locations 202 or may vary individually. In this fashion, the dimensions of apertures and general positioning of connector mounting locations 202 within frame 201 are sufficient to align moveable connectors 204 mounted or stored therein with circuitry located adjacent to frame 201.

Figure 1:
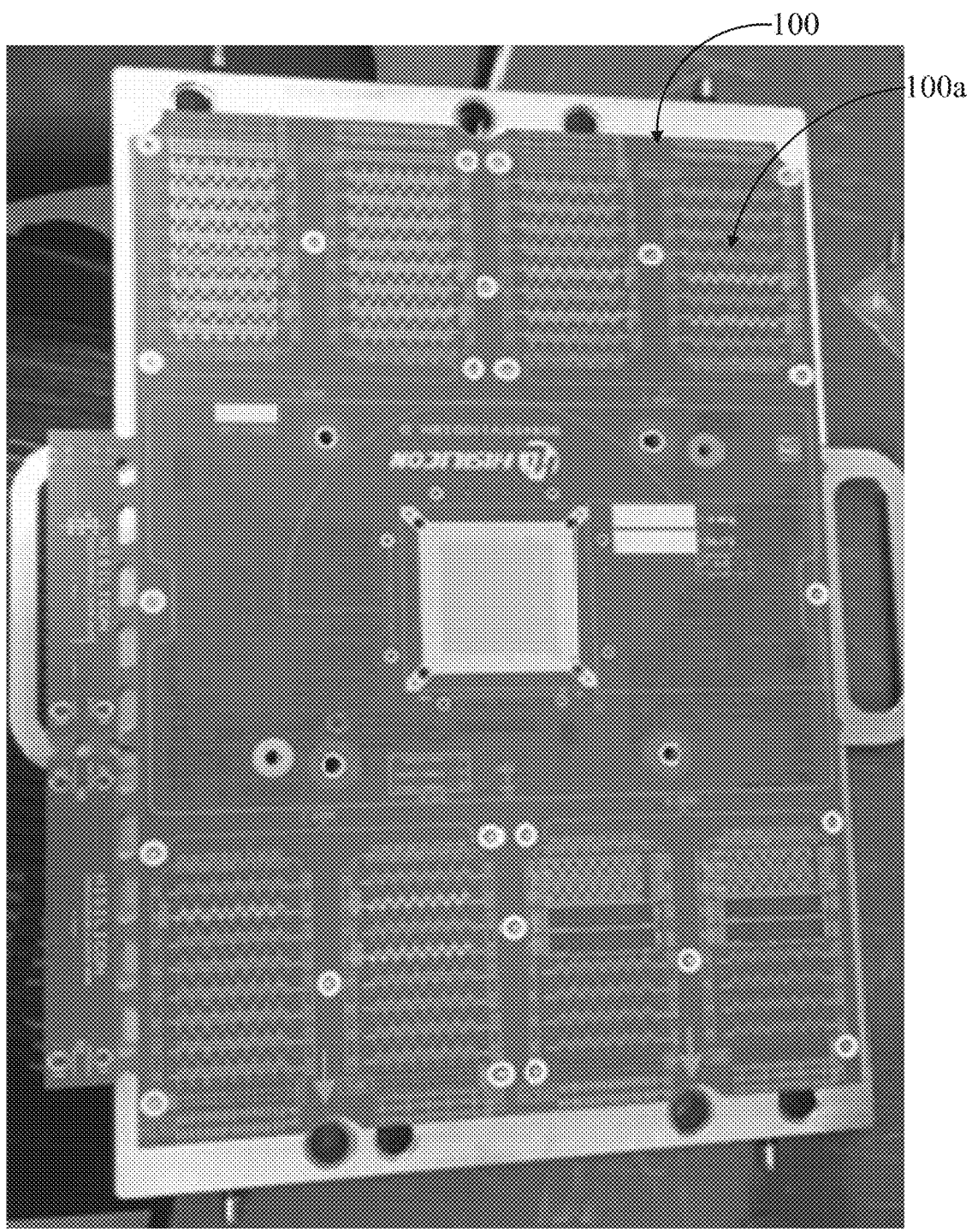
FIG. 1 is prior art depicting a conventional PCB-based load board used for interfacing to a test head for testing a DUT.
Figure 2C:
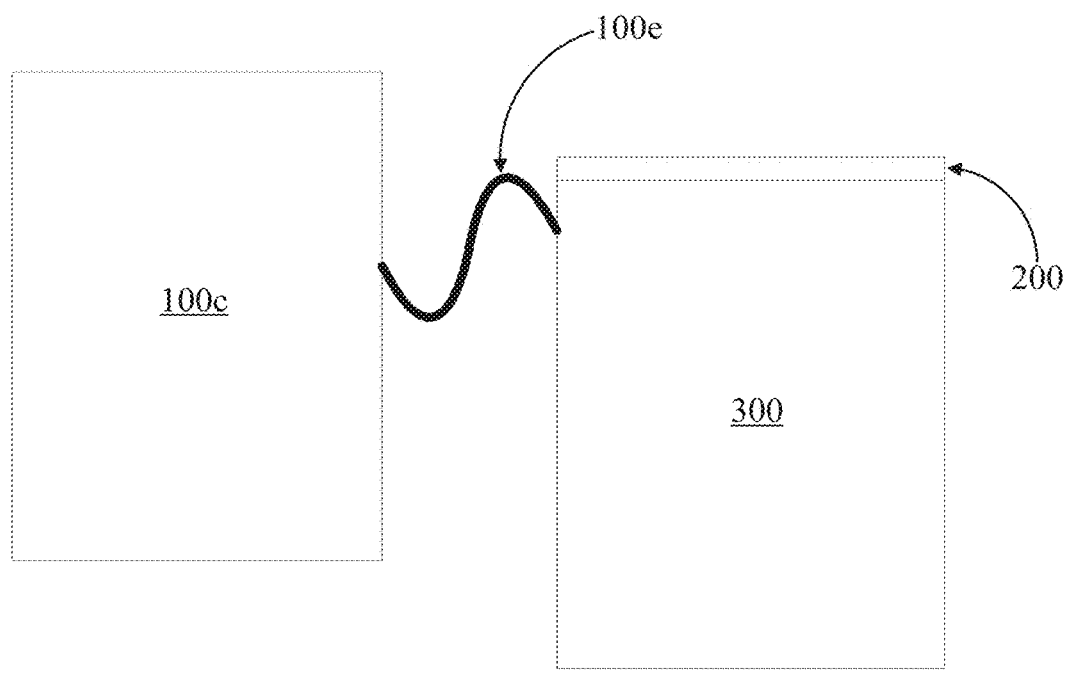
FIG. 2C illustrates a testing configuration using an exemplary universal device interface assembly in accordance with embodiments of the present disclosure.

For example, with reference to the embodiment depicted in FIG. 2C, UDI assembly 200 may be fixed in a position directly above test head 300 during a testing session. During the testing session, tester 100c may transmit test signals to test head 300 through a cable such as cable 100e. In some configurations, test head 300 may store several test boards (not pictured) which can transmit signals corresponding to test signals received from tester 100c to electrical connections or circuitry, such as pogo pins (not pictured) located along a top surface of test head 300. These pogo-pins are then used to establish electrical connections or interfaces between test head 300 and UDI assembly 200 for testing. Thus, UDI assembly 200 is fixed in a position and aligned with the tested head 300 such that test signals are transmitted from the tester 100c to a DUT mounted within UDI assembly 200. In this fashion, UDI assembly 200 eliminates the need to have any hard wired traces within a PCB load board such as test board 100 (see Prior Art FIG. 1) between the DUT socket and the pogo pin interface blocks of test head 300. The load board 200 is aligned such that the connector locations align with the interfaces of a test head.

Figure 2D:
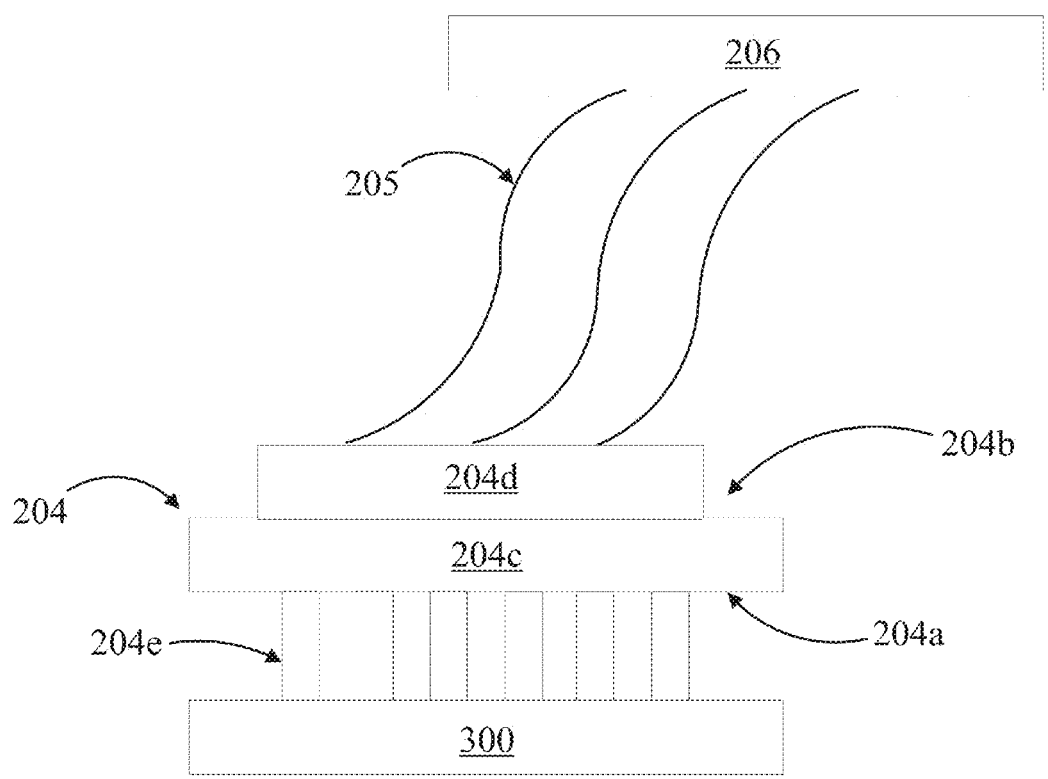
FIG. 2D depicts a moveable connector coupling within an exemplary universal device interface assembly used in accordance with embodiments of the present disclosure.

FIG. 2D depicts a moveable connector coupling performed within a universal device interface assembly in accordance with embodiments of the present disclosure. As illustrated in FIG. 2D, a moveable connector from moveable connectors 204 generally includes a pogo-pin pad interface 204a formed on one side of a moveable connector body 204c and a cable interface 204b (e.g., discrete pin or ribbon cable) formed on another side of the moveable connector body 204c. Pogo-pin pad interface 204a includes a number of pogo-pins 204e capable of transmitting signals between a moveable connector and interface circuitry found on the surface of test head 300.

Thus, when a moveable connector is mounted within a connector mounting location, the pogo-pin pad interface 204a of a moveable connector is aligned within the frame 201 of UDI assembly 200 to send and receive signals directly from a corresponding interface of the test head 300, which test head 300 is generally positioned directly beneath frame 201 during a testing session. In this manner, pogo-pins 204e can transmit and receive signals from moveable connectors 204 to electrical connections or interfaces formed on test head 300. Thus, both the dimensions and positions of connector mounting locations 202 align the pogo-pin pad interfaces of mounted moveable connectors 204 to directly interface with test head 300.

With further reference to FIG. 2D, cable interface 204b includes a surface that comprises a number of pins (not pictured), e.g., edge connector or discrete pins, capable of transmitting signals between moveable connectors 204 and a flexible cable, such as ribbon cable 205. In this fashion, pins are arranged in a manner to physically mate with edge connectors 204d formed on one end of ribbon cable 205. Thus, the dimensions and positions of connector mounting locations 202 can align ribbon cables connected to moveable connectors to directly interface with the circuitry located directly above or installed within frame 201.

Figure 3:
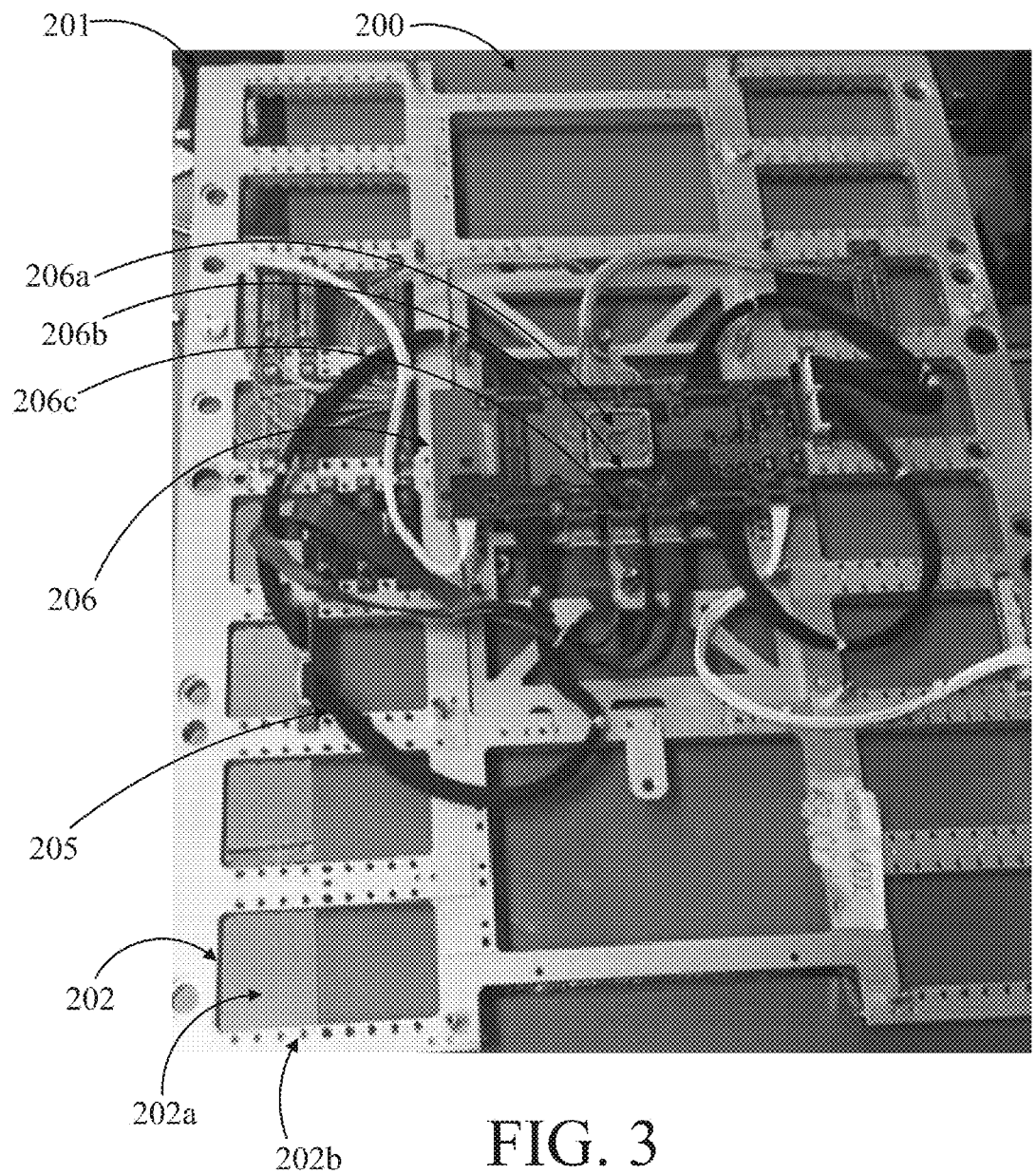
FIG. 3 is another perspective view of an exemplary universal device interface assembly in accordance with embodiments of the present disclosure.

For instance, edge connectors 204d can transmit signals from moveable connectors 204, while mounted within a connector mounting location, to electrical connections formed on circuits installed or stored within DUT mounting location 203, such as miniature test board 206 (see, e.g., FIG. 2A and FIG. 3). Thus, as depicted in FIG. 2C, while the pogo-pin pad interface of moveable connectors 204 is aligned to directly interface with test head 300 below frame 201, moveable connectors 204 uses ribbon cable 205 to interface with miniature test board 206 positioned on or directly above frame 201, thereby allowing moveable connectors 204 to simultaneously transmit and receive signals from a DUT, such as DUT 206a (see, e.g., FIG. 2A and FIG. 3), as well as test head 300.

With further reference to the embodiment depicted in FIGS. 2A, 2B, and 3, connector mounting locations can store a plurality of different moveable connectors in a parallel manner. In this fashion, each moveable connector can be aligned with each other in a manner that maximizes the number of connectors that can be stored within a connector mounting location. For instance, with reference to the embodiment depicted in FIG. 2B, the storage of moveable connectors in this fashion allows for each moveable connector to be assigned a slot within a connector mounting location. In some configurations, each slot within a connector mounting location can store a moveable connector.

Additionally, each connector mounting location includes a number of fastening grooves or holes such that a moveable connector can be securely but removably fastened to the connector mounting location. With further reference to FIGS. 1A, 1B, and 3, fastening grooves or holes (e.g., fastening holes 202b) are generally located along portions of the frame 201 that surround a connector mounting location aperture (e.g., aperture 202a). In this fashion, each connector mounting location can securely store multiple moveable connectors. Moreover, as depicted in FIGS. 1A, 1B, and 3, each slot within a connector mounting location can store a moveable connector using a pair of screws.

With reference to the embodiment depicted in FIG. 2B, frame 201 also includes at least one DUT mounting location 203 for storing a DUT board which includes a DUT (e.g., DUT 206a of FIG. 2A). According to one embodiment, DUT mounting location 203 on frame 201 includes an aperture 203a with dimensions (e.g., height, width, depth) sufficient to store miniaturized load boards (e.g., miniaturized test board 206 of FIG. 2A). For instance, the dimensions of DUT mounting location 203 is sufficient to store a miniature test board (e.g., daughterboard) that includes a DUT stored within a socket therein. In some embodiments, miniaturized test board 206 may have smaller dimensions relative to frame 201. The DUT board comprises connectors for connecting to the flexible cables that are coupled to the moveable connectors.

As such, DUT mounting location 203 may occupy more space within frame 201 relative to connector mounting locations 202. For instance, an aperture 203a of DUT mounting location 203 may be larger than an aperture 202a of a connector mounting location to accommodate the storage of a miniature test board 206 therein. Additionally, DUT mounting location 203 includes a number of fastening grooves or holes 203b such that a DUT board can be securely fastened to DUT mounting location 203. Fastening grooves or holes 103b are generally located along portions of the frame 201 that surround a DUT mounting location aperture 203a. In this fashion, each DUT mounting location can securely store a DUT board during a testing session. As depicted in FIG. 2B, DUT mounting location 203 is generally positioned in between connector mounting locations. In this fashion, a DUT mounting location can be centrally positioned relative to a number of different connector mounting locations 202, thereby allowing the DUT board to receive resources from moveable connectors stored within different connector mounting locations 202.

It is appreciated that embodiments of the present disclosure are not limited to the number of connector mounting locations and DUT mounting location depicted in the Figures of the present disclosure. As such, frame 201 may include more or less connector mounting locations and DUT mounting locations shown. In this fashion, DUT mounting locations may be positioned in between connector mounting locations along a central portion of frame 201.

Figure 4:
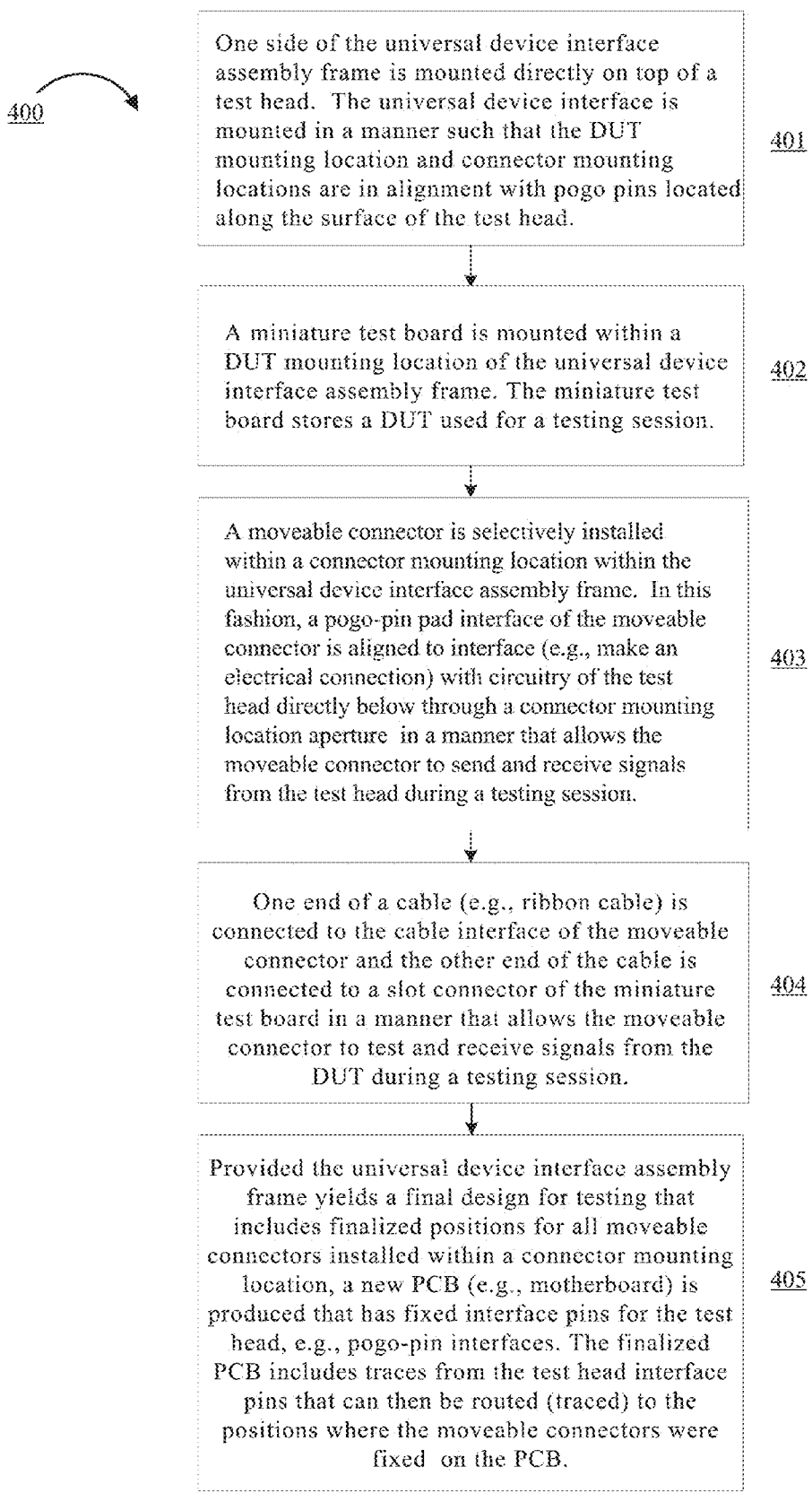
FIG. 4 is flow chart depicting a testing process using an exemplary universal device interface assembly in accordance with embodiments of the present disclosure.

FIG. 4 is flow chart of a testing process 400 using an exemplary universal device interface assembly in accordance with embodiments of the present disclosure.

At step 401, one side of the universal device interface assembly frame is mounted to and aligned with a test head. The universal device interface is mounted in a manner such that the connector mounting locations are in alignment with pogo pin interfaces located on the surface of the test head.

At step 402, a miniature test board is mounted within a DUT mounting location of the universal device interface assembly frame. The miniature test board contains a socket for storing a DUT used for a testing session.

At step 403, a moveable connector is selectively installed within a connector mounting location within the universal device interface assembly frame. In this fashion, a pogo-pin pad interface of the moveable connector is aligned to interface (e.g., make an electrical connection) with test head circuitry directly below through a connector mounting location aperture in a manner that allows the moveable connector to send and receive signals from the test head during a testing session.

At step 404, one end of a flexible cable (e.g., ribbon cable) is connected to the cable interface of the moveable connector and the other end of the cable is connected to a slot or interface connector of the miniature test board in a manner that allows the moveable connector to test and receive signals from the DUT during a testing session. In this way, the interface of the test head is connected to pins of the DUT. This process is then repeated, as necessary, for other discrete interfaces of the test head.

At step 405, provided the universal device interface assembly frame yields a final design for testing that includes finalized positions for all moveable connectors installed within a connector mounting location, a new PCB (e.g., motherboard) can be produced based thereon that has fixed interface pins for the test head, e.g., pogo-pin interfaces. The finalized PCB includes traces from the test head interface pin that can then be routed (traced) to the positions where the moveable connectors were fixed on the PCB.

According to one embodiment of the present disclosure, the miniature test board 206 may be developed and tested by a user prior to being imported into UDI assembly 200 for further testing purposes. In this fashion, a designer may perform various tests and gather electrical characteristics and metrics on the miniature test board 206 (e.g., benchmark tests) in a manner that provides the designer with an understanding about the general performance of a DUT installed within miniature test board 206 in an environment that is separate from a testing environment involving the use of UDI assembly 200. In this fashion, a user may use UDI assembly 200 to further calibrate the performance of a DUT by performing further tests.

For example, with further reference to the embodiment depicted in FIG. 3, electrical characteristics concerning ports 206c (e.g., edge connectors) of miniature test board 206 configured to electrically interface with pin-socket connections 206b adapted to receive a DUT may be tested during a testing session prior to the use of UDI assembly 200. As such, a first determination may be made that a circuit configuration involving the miniature test board 206 and a DUT stored therein yielded desirable results because electrical connections positioned in fixed locations within miniature test board 206 functioned in a satisfactory manner.

As such, miniature test board 206 may then be subsequently imported and installed within DUT mounting location 203 of frame 201 for further testing.

Once miniature test board 206 is installed within frame 201, another determination may be made that the physical configuration of moveable connectors 204 and miniature test board 206 yielded desirable test results. For instance, during a testing session involving UDI assembly 200, a tester may have been satisfied with the quality of signal transmission (e.g., strength, signal throughput, etc.) between electrical connections formed on miniature test board 206 and connectors stored within connector mounting locations 204 on frame 201. As such, the final positions of the moveable connectors 204 and miniature test board 206 in this configuration or "connection layout" can then be saved as a final design for fabricating a new load board (e.g., mother board, daughter board) for an end user.

For instance, according to one embodiment, a new PCB can be fabricated to replace frame 201 based on the connection layout between miniature test board 206 and a test head. Tracing materials may be used to trace a route from the final or permanent positions of the moveable connectors 204 stored within connector mounting locations 202 to final or permanent positions of connectors of miniature test board 206. According to one embodiment, a new PCB can be fabricated based on permanent located connectors for connecting to a test head By mapping routes in this fashion, the number iterations required for circuit development can be drastically reduced.

For purposes of testing, a tester may also rely on the validated positions of the moveable connectors 204 and miniature test board 206 to test aspects of a different circuit board design. For instance, these validated positions may allow a tester to focus issues related to routing between a DUT and difference resources or electrical devices located on the circuit board. In some scenarios, these validated positions of connectors may be saved and directly placed in production-ready devices. For example, for purposes of production, a tester may bypass further prototyping and/or testing procedures and install the validated miniature test board 206 as a production-ready component in a computer system. Thus, the reliability of the validated connector positions may allow a tester to save time and resources that would otherwise be unnecessarily spent on testing procedures.

Figure 5:
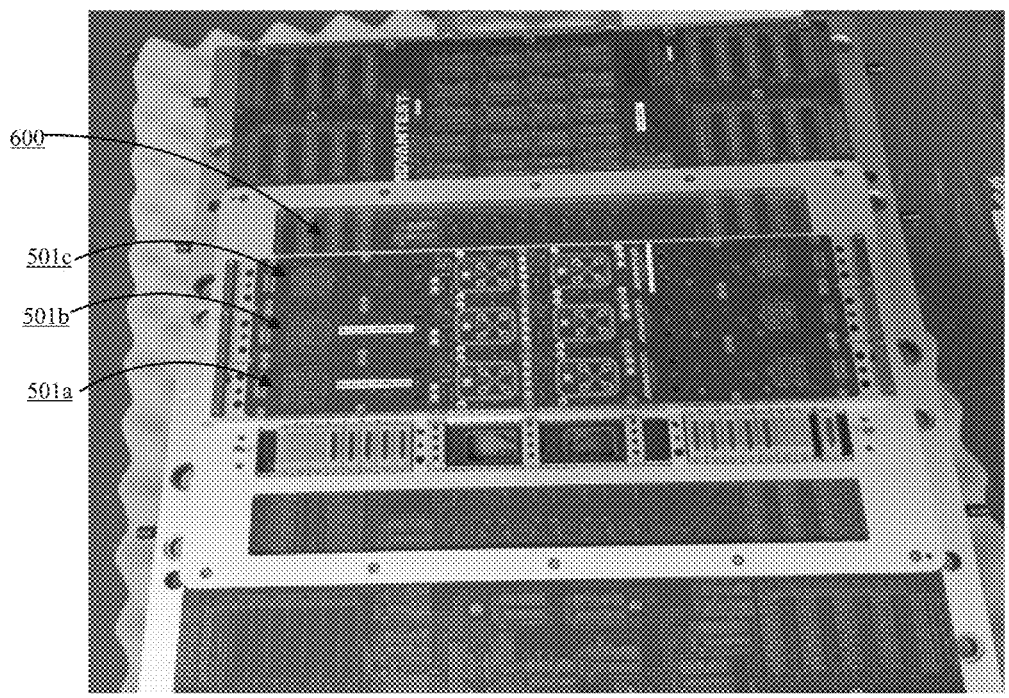
FIG. 5 depicts a modular load board design having multiple daughter boards produced using an exemplary universal device interface assembly in accordance with embodiments of the present disclosure.
Figure 6:
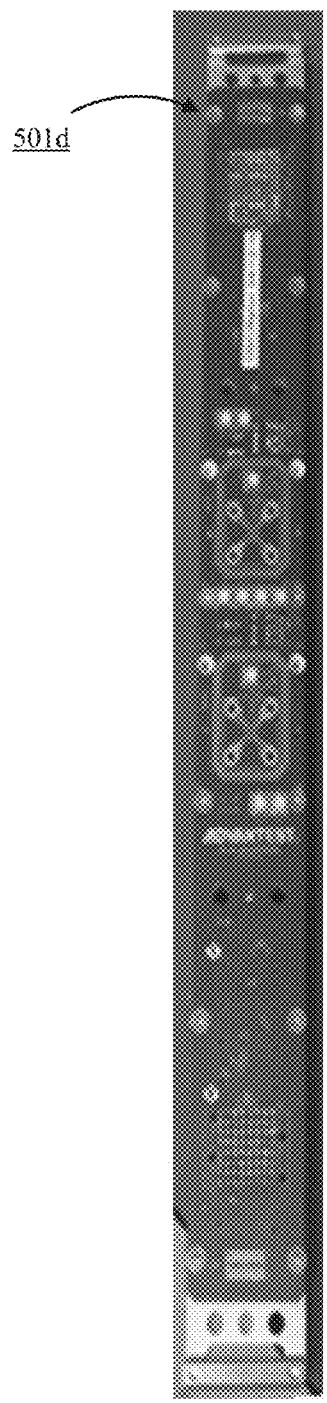
FIG. 6 depicts a finalized daughter board produced using an exemplary universal device interface assembly in accordance with embodiments of the present disclosure.

According to some embodiments, multiple daughter boards generated through embodiments of the present disclosure can be connected to a same motherboard PCB in order to test multiple DUTs at the same time depending on available resources. For instance, FIG. 5 illustrates a modular load board design having a number of different daughter boards 501*a*, 501*b*, and 501*c* connected thereto and aligned in parallel with each other. In this illustration, one daughter board is removed (daughter board 501*d* in FIG. 6) to illustrate the physical connections on the motherboard PCB 600, which is located underneath daughter boards 501*a*, 501*b*, and 501*c*. FIG. 6 illustrates daughter board 501*d*, which is a finalized modular load board capable of being used for production level testing in accordance with embodiments of the present disclosure. FIG. 6 depicts the physical connections on the motherboard PCB 600 that would mate with a daughter board produced by embodiments of the present disclosure.

Thus, once the combination of the daughter board and the load board frame (e.g., frame 201) yield a final design for testing, frame 201 can be replaced with a specialized motherboard PCB that has fixed interface pins for the test head, e.g., pogo pin interfaces. In the motherboard PCB, the traces from the tester head interface pin can then be routed (traced) to connectors at fixed positions on the motherboard PCB that physically align with the physical interface connectors on the daughterboard, whose locations and electrical characteristics are already known. Thus, daughter boards produced by embodiments of the present disclosure can then be physically connected to the motherboard PCB to yield a final modular load board that can be used for production testing.

FIG. 7 is flow chart of a testing process 700 using an exemplary universal device interface assembly in accordance with embodiments of the present disclosure.

At step 701, a miniature test board, including a DUT stored therein, is benchmark tested in a lab by a user in a first testing session within a testing environment that does not include the UDI assembly. During this first testing session, various tests are performed on the miniature test board to gather metrics (e.g., benchmark tests, electrical characteristics, etc.) in a manner that provides the user with an understanding about the general performance of the DUT installed within miniature test board in an environment that is separate from a testing environment involving the use of UDI assembly. Importantly, the miniature test board is characterized electrically while the DUT is installed therein.

At step 702, provided a determination is made that the miniature test board and DUT stored therein yielded desirable results during the first testing session, the miniature test board is imported and installed within a DUT mounting location of a UDI assembly for testing during a second testing session.

At step 703, a determination is made that the physical configuration of the circuits stored within the UDI assembly (e.g., moveable connectors, miniature test board) is satisfactory based on the quality of the performance of electrical connections formed on the miniature test board and moveable connectors stored within the frame of UDI assembly.

At step 704, the final positions of the moveable connectors and miniature test board in the configuration determined at step 703 are saved as a final design for fabricating a new load board (e.g., mother board, daughter board) for an end user. The new PCB is fabricated to replace frame using tracing materials in the PCB to trace routes from the final positions of the moveable connectors stored within connector mounting locations to final positions of a DUT positioned within the miniature test board of the same configuration. The fully characterized daughter board can then be installed in the PCB version of the load board to complete the final load board design that is ready for production-level testing (see, e.g., FIG. 5).

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the present disclosure are thus described. While the present disclosure has been described in particular embodiments, it should be appreciated that the invention should not be construed as limited by such embodiments, but rather construed according to the below claims.

What is claimed is:

1. An apparatus for testing a device under test (DUT), said apparatus comprising:
   a frame comprising:
      a DUT mounting location, wherein said DUT mounting location is adapted to removeably mount a miniature test board configured to electrically and physically interface with said DUT during a testing session; and
      a plurality of connector mounting locations operable to align with a plurality of interfaces of a test head, wherein each connector mounting location is adapted to removeably mount a respective removable connector from a plurality of removable connectors operable to be connected to said plurality of interfaces of said test head wherein each removable connector is coupled to a respective flexible cable of a plurality of flexible cables, wherein said plurality of flexible cables are operable to connect, respectively, to a plurality of cable interfaces of said miniature test board, wherein said DUT is configured to receive and transmit test signals associated with said test head using said plurality of flexible cables, said plurality of removable connectors and said plurality of cable interfaces.

2. The apparatus described in claim 1, wherein said frame comprises a plurality of fastening holes, wherein each connector mounting location of said plurality of connector mounting locations comprise a set of fastening holes of said plurality of fastening holes and is adapted to mount a respective removable connector from said plurality of removable connectors using said set of fastening holes.

3. The apparatus described in claim 2, wherein a respective removable connector of said plurality of removable connectors is removeably mounted onto a respective connector mounting location of said plurality of connector mounting locations using a pair of fastening holes from said plurality of fastening holes.

4. The apparatus described in claim 1, wherein said frame further comprises a plurality of fastening holes located along portions thereof surrounding said DUT mounting location to mount said miniature test board.

5. The apparatus described in claim 1, wherein said frame further comprises a plurality of fastening holes for aligning and mounting said frame to said test head.

6. The apparatus described in claim 1, wherein said DUT mounting location is positioned between said plurality of connector mounting locations.

7. The apparatus described in claim 1, wherein said frame comprises a handle.

8. An apparatus for testing a device under test (DUT), said apparatus comprising:
   a frame comprising:
      a DUT mounting location adapted to removeably mount a daughter board configured to electrically and physically interface with said DUT during a testing session;
      a plurality of connector mounting locations operable to align with a plurality of interfaces of a test head, wherein each connector mounting location is adapted to removeably mount a respective removable connector from a plurality of removable connectors operable to be connected to said plurality of interfaces of said test head wherein each removable connector is coupled to a respective flexible cable of a plurality of flexible cables, wherein said plurality of flexible cables are operable to connect, respectively, to a plurality of cable interfaces of said daughter board, wherein said DUT is configured to receive and transmit test signals associated with said test head using said plurality of flexible cables, said plurality of removable connectors and said plurality of cable interfaces; and
      a first plurality of fastening holes disposed in said plurality of connector mounting locations for removeably mounting said plurality of removeable connectors.

9. The apparatus described in claim 8, wherein said DUT mounting location is positioned between at least two connector mounting locations of said plurality of connector mounting locations.

10. The apparatus described in claim 8, wherein each connector mounting location of said plurality of connector mounting locations is adapted to store different removable connectors from said plurality of removable connectors using said plurality of fastening holes.

11. The apparatus described in claim 9, wherein a respective removable connector of said plurality of removable connectors is mounted onto a respective connector mounting location of said plurality of connector mounting locations using a respective pair of fastening holes from said plurality of fastening holes.

12. The apparatus described in claim 8, wherein said frame further comprises a second plurality of fastening holes located along portions of said frame surrounding said DUT mounting location to mount said daughter board to said frame.

13. The apparatus described in claim 12, wherein said frame further comprises a third plurality of fastening holes for aligning and mounting said frame to said test head.

14. The apparatus described in claim 8, wherein said DUT mounting location comprises a larger portion of said frame relative to a connector mounting location of said plurality of connector mounting locations and wherein said plurality of flexible cables comprise ribbon cables.

15. An apparatus for testing a device under test (DUT), said apparatus comprising:
   a frame comprising:
      a first mounting location, wherein said first mounting location is adapted to removeably mount a miniature test board configured to electrically and physically interface with said DUT during a testing session and wherein said miniature test board comprises a plurality of cable interfaces; and a plurality of second mounting locations operable to align with a plurality of interfaces of a test head, wherein each second mounting location is adapted to removeably mount a respective removable connector from a plurality of removable connectors operable to be connected to said plurality of interfaces of said test head wherein each removable connector is coupled to a respective ribbon cable of a plurality of ribbon cables, wherein said plurality of ribbon cables are operable to connect, respectively, to said plurality of cable interfaces of said miniature test board, wherein said DUT is configured to receive and transmit test signals associated with said test head using said plurality of ribbon cables, said plurality of removable connectors and said plurality of cable interfaces.

16. The apparatus described in claim 15, wherein said frame further comprises a plurality of fastening holes, wherein each second mounting location of said plurality of second mounting locations is adapted to mount different removable connectors from said plurality of removable connectors using said plurality of fastening holes.

17. The apparatus described in claim 16, wherein a respective removable connector of said plurality of removable connectors is mounted onto a respective second mounting location of said plurality of second mounting locations using a pair of fastening holes from said plurality of fastening holes.

18. The apparatus described in claim 15, wherein said frame further comprises a plurality of fastening holes located along portions of said frame surrounding said first mounting location to mount said miniature test board to said frame.

19. The apparatus described in claim 15, wherein said frame comprises a plurality of fastening holes for aligning and mounting said frame to said test head.

20. The apparatus described in claim 15, wherein said first mounting location is positioned in a central location of said frame.

* * * * *